United States Patent [19]
Ernyei et al.

[11] 4,114,454
[45] Sep. 19, 1978

[54] METHOD OF MEASURING THE RESONANCE FREQUENCY OF MECHANICAL RESONATORS

[75] Inventors: Herbert Ernyei; Etienne Langlois, both of Paris, France

[73] Assignee: Societe Telegraphiques et Telephoniques, Paris, France

[21] Appl. No.: 810,405

[22] Filed: Jun. 27, 1977

[30] Foreign Application Priority Data

Jun. 29, 1976 [FR] France .................. 76 19676
Apr. 25, 1977 [FR] France .................. 77 12409

[51] Int. Cl.² ........................................... G01M 7/00
[52] U.S. Cl. ................................................. 73/579
[58] Field of Search ............... 73/579, 574, 662, 664, 73/576

[56] References Cited

U.S. PATENT DOCUMENTS

| | | | |
|---|---|---|---|
| 3,323,352 | 6/1967 | Bronson | 73/574 X |
| 3,391,560 | 7/1968 | Mathey | 73/579 |
| 3,580,056 | 5/1971 | Warner | 73/579 |

*Primary Examiner*—Jerry W. Myracle

[57] ABSTRACT

The resonance frequency of rod shaped mechanical resonators with a high quality factor such as used in electromechanical filters is obtained by shock exciting the resonator into vibration introduced into a solenoid collecting a voltage induced by said vibration across the solenoid terminals. Said shock is either mechanical or magnetic.

9 Claims, 6 Drawing Figures

METHOD OF MEASURING THE RESONANCE FREQUENCY OF MECHANICAL RESONATORS

BACKGROUND OF THE INVENTION AND PRIOR ART

The present invention concerns a method of rapidly and accurately measuring the resonance frequency of a mechanical resonator, and it is more particularly interesting in the case of resonators consisting of solid metal bars of generally cylindrical form such as are used in electromechanical filters.

Usually, the resonance frequency of mechanical resonators, for example of steel bars, is determined in a bridge arrangement supplied by a variable frequency source. The resonator is disposed in a coil which is supplied by the variable frequency source constituting one of the arms of the bridge. In addition, the oscillating conditions under which the resonator is placed vary in accordance with the operational mode, which often involves the use of a delicate fixture. In the measurement, the bridge is balanced with the source frequency close to resonance frequency, and the frequency at which the unbalance of the bridge is maximum has to be found. This operation is relatively lengthy.

The method according to the present invention relies on the excitation of the resonator into vibration under the influence of a shock. The sensor consists of a solenoid which is operated with a weak magnetizing flux in which the resonator is positioned. The vibrations of the resonator modify the distribution of the flux in the coil and develop an induced voltage. Then counting the number of vibrations of the bar during a fixed period of time or measuring the duration corresponding to an integral number of vibrations, will provide the value of the resonance frequency. The duration of the measurement depends upon the damping of the vibrations. In the case of high performance resonators, it may reach about a hundred of milliseconds, and in this case a frequency measuring precision of the order to $10^{-6}$ can be obtained.

The measuring method needs a magnetizing flux in the solenoid. Depending upon the nature of the resonator, it may be created either by the resonator itself if it is magnetic or by an external magnet, or else by a direct current flowing through the coil constituting the solenoid. The excitation of the resonator by shock in accordance with the present invention must be so carried out as to develop the desired mode of vibration. It is well known to emphazise one mode of excitation with respect to other modes, even of near-by frequencies, by means of proper fixtures in or on the resonator. The shock by which the vibration of the resonator is brought about is of mechanical or magnetic origin, depending upon the embodiments.

BRIEF DESCRIPTION OF THE DRAWINGS

The invention will be readily understood from the following description relating to the application of the method according to the invention to the measurement of the natural resonance frequency of metal bars vibrating in the fundamental longitudinal mode, it being understood that this example is given without any limiting character.

In the accompanying figures.

DETAILED DISCLOSURE OF THE INVENTION

Figure 1:
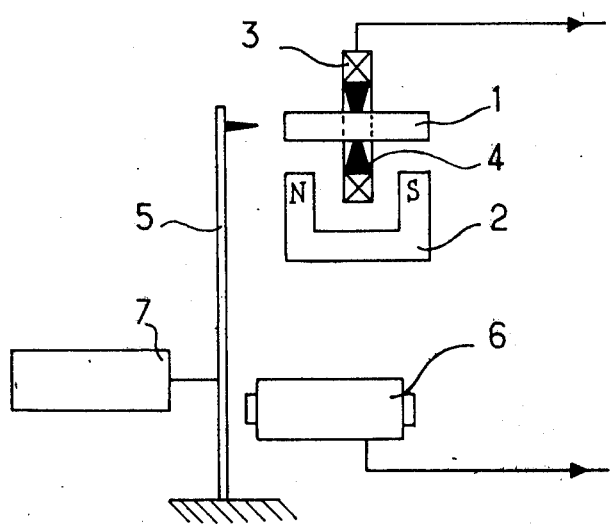
FIG. 1 is a diagram of an arrangement of the measuring head.

An embodiment of the measuring head is illustrated in FIG. 1. The bar 1 constitutes the resonator the frequency of which has to be measured. It is disposed in the magnetizing field created by the permanent magnet 2 along the axis of a coil 3. The fixture must not reduce the quality factor of the resonator. Satisfactory results are obtained by maintaining the bar in a vibration mode by means of an annulus 4 of flexible material. The hammer 5 controlled by the electromagnet 6 strikes the bar and sets it in vibration. A damping system 7 limits the vibrations of the hammer. After the shock, the amplitude of the vibration decreases with a time constant proportional to the quality factor of the material. The oscillations of the bar modify the magnetic flux within the coil, whereby there is generated across the terminals of the coil an induced voltage which constitutes the signal used for the measurement. The signal is processed in the circuit illustrated in FIG. 2.

After amplification at 11 the signal passes through a bandpass filter 12 centered on a frequency close to the resonance frequency of the bar, as computed from the dimensions of the said bar. The said filter may consist of a T-shaped cell having inductances and capacitances of the type described in the book "Reference Data for Radio Engineers," published by III (5th edition, 1969), Chapter 8. The said filter has the object of reducing noise and of selecting the resonance frequency to be measured.

In order to obtain acceptable sensitivity, a non-linear amplifier 13 is provided, which consists of an integrated amplifier of the type 709 (supplied by Texas Instruments), provided with a negative feedback by means of a diode network, the gain of the circuit increases when the amplitude of the signal decreases in accordance with a quasi-logarithmic law.

The shaping circuit 14 having adjustable thresholds (consists of a circuit of the type 7400 supplied by Texas Instruments) takes the useful signal out from the noise residue so as to supply a square-wave signal compatible with the input characteristics of the frequency meter.

A delayed control circuit 15 feeds the electromagnet, which produces the stroke of the hammer 5. The said circuit controls also the return to zero and the starting of the frequency meter. Two measuring circuits are diagrammatically illustrated in FIG. 2, these circuits being connected to terminals A and B.

A first frequency meter consists of the circuits 16 to 21. Circuit 16 opens gate 17 during $10^n$ periods of the signal, during which time the pulses of the cristal time base 18 are counted in the counter 19, the number of pulses being reciprocated in processor 20. Display unit 21 plots the result of the measurement and stores it (these circuits may be built up from integrated circuits described in "Manuel d'applications des circuits integres digitaux T T L", published by Texas Instruments, France).

When the vibration is obtained during more than 100 ms with sufficient amplitude, the circuits 16 to 21 can be replaced by a frequency meter 22 of the type 2620 manufactured by the company Schlumberger. This instrument makes it possible to obtain a precision of $\pm 10^{-6}$ for a count duration of about 100 ms.

The fixture used in the head of FIG. 1 is fairly fragile and must be adapted to the cross-section of the resonator to be tested.

Figure 3:
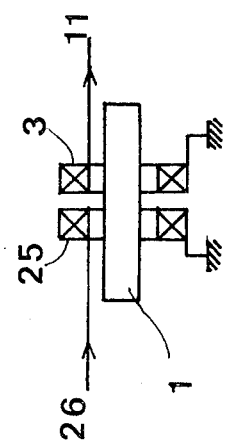
FIG. 3 is a circuit diagram of a variant of the measuring head.

For utilization on a high-speed automatic machine, it is desirable to avoid fragile moving parts. Also, it is desirable to be able to measure with the same device parts whose cross-sections are slightly different. FIG. 3 shows a measuring head also designed for measuring the resonance frequency of a resonator vibrating in longitudinal mode, which may be better adapted to large scale testing of bars. A current pulse is applied to a coil 25, which replaces the hammer 5. The magnetic shock excites the vibrations of the bar 1, which retains sufficient remanent magnetization for its oscillations to produce in the coil 3 an induced voltage constituting the signal to be measured. No fixture is required. The frequency of bars having very different cross-sections can be measured in the same head, and the bar can be shifted a number of millimeters without any effect on the accuracy. The resonator rests in the coil and its introduction in the head does not require any handling. The use of such a head is of particular interest when it is necessary to emphazise one mode of vibration by means of the fixture.

The amplitude of the magnetic field pulse is sufficient for the single shock to excite the bar with sufficient amplitude to ensure that the duration of the oscillations permits an accurate measurement, taking into account the spontaneous damping. In the case where the vibrational characteristics of the alloy of which the resonator consists depend upon the magnetization, it may be necessary to limit the strength of the pulses, a loss of accuracy has to be accepted. If it is not possible, the head of FIG. 1 may be considered more suitable. In a particular embodiment driving coil 25 has 10 turns and the current pulse has a value of about 1 Amp. and a duration of 4 $\mu$s approximately.

Figure 4:
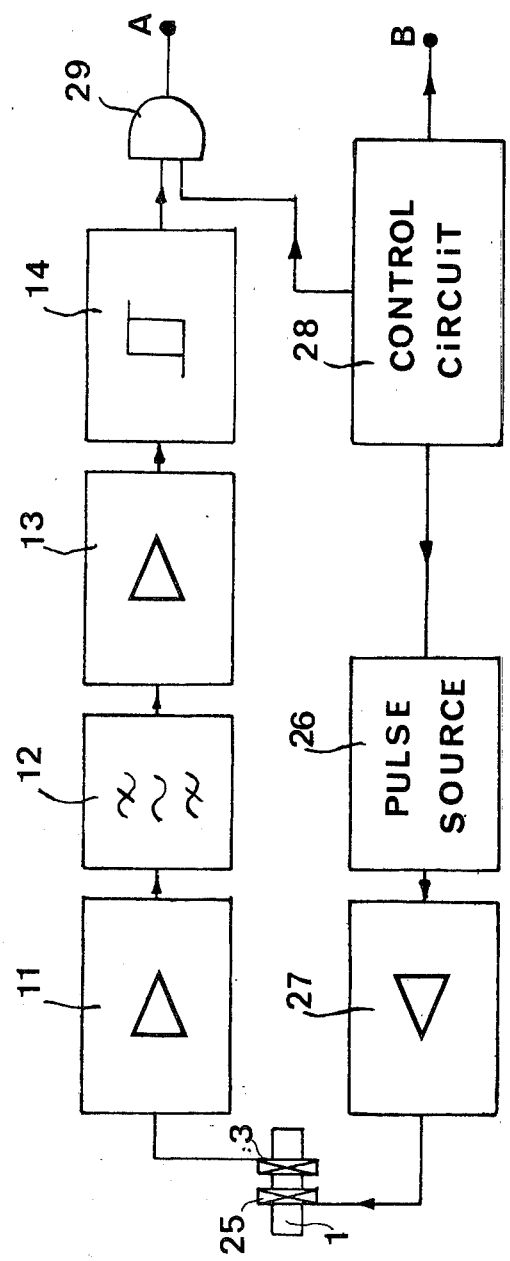
FIG. 4 is a block diagram of the network for processing the signal supplied by the head of FIG. 3, and FIGS. 5 and 6 are calibration curves of one embodiment of the invention.

The circuits for controlling and processing the signal are illustrated in FIG. 4. Circuits identical to those of FIG. 2 bear same reference numbers. The pulse source 26 supplies pulses of a duration approximately equal to a half-cycle of the vibration of the resonator, whereby the desired mode is emphazised. Amplifier 27 energizes coil 25. The amplification network (11, 12, 13, 14) for the signal picked up by coil 3 is identical to that described in the foregoing. A stage 29 is added to clamp out the initial signal which is disturbed by the voltage induced in coil 3 by the pulse applied to coil 25 due to coupling between the two coils. The control circuit 28 controls the circuits 26 and 29 and the resetting of the counter.

With such a device, it has been possible to carry out more than two measurements per second with a precision of $10^{-6}$ at a frequency in the neighbourhood of 130,000 Hz.

The precision and the sensitivity of the measurements obtained by the application of the invention can be briefly shown as follows.

Let $A_0$ be the initial amplitude of the input signal to the processing circuits $A_1$ the amplitude of the input signal which corresponds to the threshold of the circuit 14 (FIG. 2) after processing by the circuits 11, 12 and 13

$F_s$ the resonance frequency in the operating mode

Q the quality factor of the bar $t_m$ the duration of the measurement $t$ the time counted from the shock and the starting of the measurement.

The amplitude of the signal follows the law $A(t) = A_0 \exp -\pi F_s t_m/Q$. For the duration $t_m$, the signal must be greater than $A_1$. Therefore, the amplitude at the beginning of the cycle must be:

$$A_0 > A_1 \exp \pi F_s t_m/Q$$

This condition defines the sensitivity of the method.

The error of the frequency measurement $\Delta F_s/F_s$ is inversely proportional to $t_m$. When the measuring time is an integral multiple of the period of the signal to be measured, the measurement error is:

$$\Delta F_s/F_s = 1/t_m \cdot F_p$$

$F_p$ being the frequency of the local signal used to count $t_m$.

Figure 5:
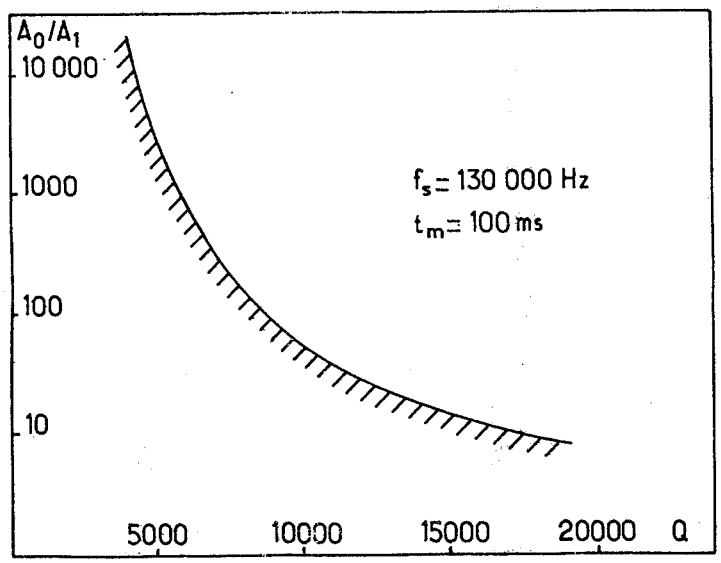
Figure 6:
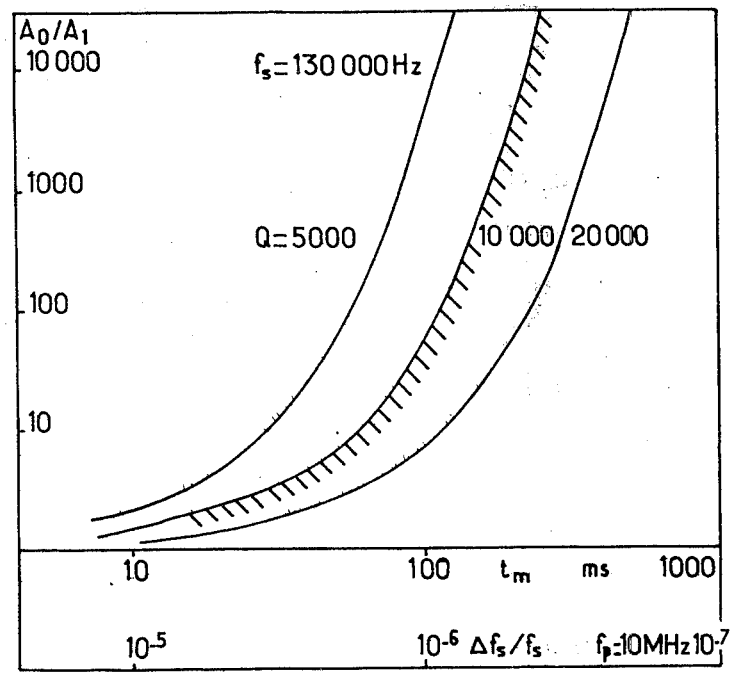

The curves of FIGS. 5 and 6 make it possible to define the measuring conditions. FIG. 5 gives the minimum ratio $A_0/A_1$ for a measuring time of 100 ms, as a function of the quality factor of the resonator.

FIG. 6 illustrates the variation of the minimum ratio $A_0/A_1$ as a function of the measuring time (or of the measuring accuracy), assuming that a frequency meter of the aforesaid type is used, of which the local frequency is 10 MHz. The various curves correspond to the various values of the quality factor of the bar, which are shown beside the curves.

Figure 2:
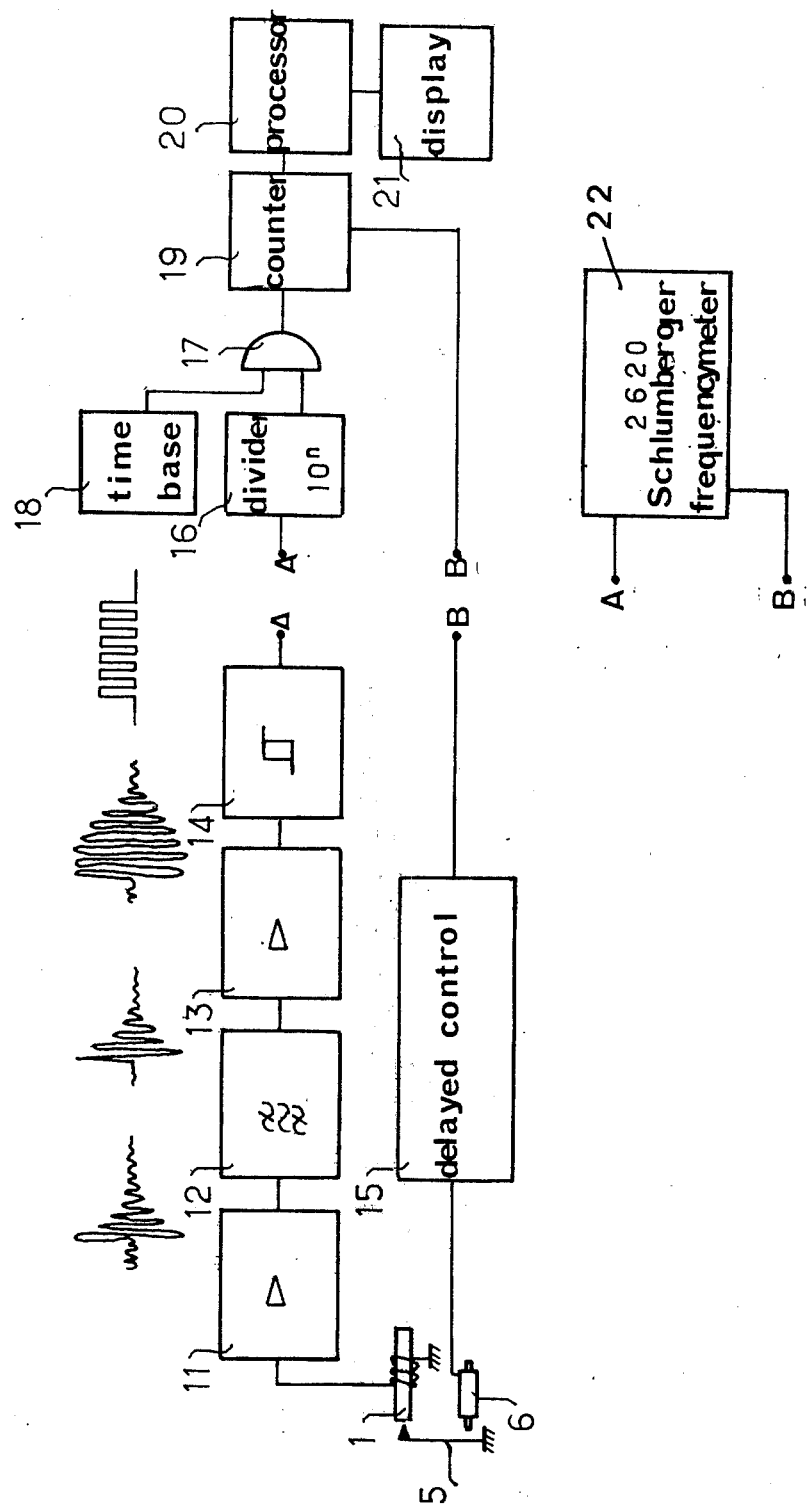
FIG. 2 is a block diagram of the network for processing a signal supplied by the head of FIG. 1.

A measuring instrument was produced according to FIGS. 1 and 2 embodiment for measuring the frequency of longitudinal vibration frequency of alloy bars of the Elinvar or Thermelast type operating close to 130 kHz. The accuracy of the measurement is equal to $\pm 0.1$ Hz, the complete duration of the measurement being less than 500 ms.

What we claim:

1. A method of measuring the resonant frequency of a mechanical resonator oscillating in a given mode, the steps comprising:
   positioning the resonator within a solenoid;
   establishing a magnetic field along the axis of said solenoid;
   shock exciting said resonator into oscillation in the desired mode at an initial time to induce a voltage in said solenoid having a component, the frequency of which is proportional to the resonant frequency of the resonator; and
   amplifying, filtering, and shaping said induced voltage to energize a visual display of the resonant frequency of the resonator under test.

2. Method of measurement according to claim 1, wherein the magnetic field is established in the solenoid by means of external magnets.

3. Method of measurement according to claim 1, wherein the resonator is magnetic.

4. A method as defined by claim 1 including counting the number of periods of the induced voltage.

5. Method of measurement according to claim 4, wherein the duration of the count is less than 100 milliseconds.

6. A method as defined by claim 1 including counting the time required for a predetermined number of oscillations of the resonator.

7. Apparatus for measuring the resonant frequency of a cylindrical bar—mechanical resonator comprising:
   a resonator fixture including a solenoid surrounding and supporting the resonator at a vibration node;
   an electro-magnetically driven hammer positioned to strike the bar;
   a time base circuit connected to control said hammer;
   a signal processing network, the input of which is connected to said solenoid; and
   a measuring instrument connected to be triggered and reset by said time base and also connected to the output of said network.

8. A measuring apparatus as defined in claim 4 wherein said signal processing network comprises:
   a non-linear amplifier;
   a band-pass filter tuned to the approximate frequency to be measured and connected to the output of said amplifier; and
   a shaping circuit connecting between said filter and said measuring apparatus.

9. Apparatus for measuring the resonant frequency of a cylindrical bar resonator comprising:
   two coaxial solenoids spaced axially from each other;
   a driving pulse generator connected to supply the first of said solenoids;
   a signal processing network the input of which is connected to said second solenoid;
   a measuring device connected to the output of said network; and
   a time base circuit connected to control said pulse generator and reset said measuring device.

* * * * *